United States Patent
Daniel et al.

(10) Patent No.: US 10,684,344 B2
(45) Date of Patent: Jun. 16, 2020

(54) MOTION CORRECTION IN TWO-COMPONENT MAGNETIC RESONANCE IMAGING

(71) Applicant: The Board of Trustees of the Leland Stanford Junior University, Palo Alto, CA (US)

(72) Inventors: Bruce L. Daniel, Stanford, CA (US); Brian A. Hargreaves, Menlo Park, CA (US); Subashini Srinivasan, Palo Alto, CA (US)

(73) Assignee: The Board of Trustees of the Leland Stanford Junior University, Stanford, CA (US)

( * ) Notice: Subject to any disclaimer, the term of this patent is extended or adjusted under 35 U.S.C. 154(b) by 312 days.

(21) Appl. No.: 15/476,810

(22) Filed: Mar. 31, 2017

(65) Prior Publication Data

US 2017/0285125 A1     Oct. 5, 2017

Related U.S. Application Data

(60) Provisional application No. 62/317,112, filed on Apr. 1, 2016.

(51) Int. Cl.
*G01R 33/565*     (2006.01)
*G01R 33/48*     (2006.01)
*G01R 33/56*     (2006.01)

(52) U.S. Cl.
CPC ... *G01R 33/56509* (2013.01); *G01R 33/4828* (2013.01); *G01R 33/5601* (2013.01)

(58) Field of Classification Search
CPC .......... G01R 33/56509; G01R 33/4828; G01R 33/5601
(Continued)

(56) References Cited

U.S. PATENT DOCUMENTS

| 7,592,810 B2 * | 9/2009 | Reeder | G01R 33/4828 |
| | | | 324/307 |
| 8,781,197 B2 * | 7/2014 | Wang | G01R 33/54 |
| | | | 382/131 |

(Continued)

FOREIGN PATENT DOCUMENTS

EP     2626718     8/2013

OTHER PUBLICATIONS

Dixon, "Simple Proton Spectroscopic Imaging", 1984, Radiology v153, pp. 189-194.
(Continued)

*Primary Examiner* — Gregory H Curran
(74) *Attorney, Agent, or Firm* — Lumen Patent Firm

(57) ABSTRACT

Improved motion correction for magnetic resonance imaging is provided. An MR imaging method provides a first sequence of MR images and a second sequence of MR images where: 1) the two sequences are inherently spatially co-registered and synchronous with each other; 2) the first sequence includes signal variation due to one or more causes other than motion or deformation; and 3) the second sequence does not include the signal variation of the first sequence. In this situation, the second sequence can be used to perform motion correction for the first sequence. One example of this approach is Dixon MR imaging, where the water images are the first sequence and the fat images are the second sequence.

7 Claims, 9 Drawing Sheets

(58) Field of Classification Search
USPC .......... 324/300–322; 600/407–435; 382/128–131
See application file for complete search history.

(56) References Cited

U.S. PATENT DOCUMENTS

| | | | | |
|---|---|---|---|---|
| 8,948,536 | B2* | 2/2015 | Boernert | G01R 33/4828 382/232 |
| 9,659,370 | B2* | 5/2017 | Buerger | G01R 33/481 |
| 2007/0285094 | A1* | 12/2007 | Reeder | G01R 33/4828 324/313 |
| 2011/0044524 | A1* | 2/2011 | Wang | G01R 33/54 382/131 |
| 2013/0089271 | A1* | 4/2013 | Boernert | G01N 24/08 382/274 |
| 2017/0285125 | A1* | 10/2017 | Daniel | G01R 33/56509 |

OTHER PUBLICATIONS

Huo et al, "Turboprop IDEAL: a motion-resistan fat-water separation technique", 2009, Magn. Reson Med. v61n1 (abstract).

\* cited by examiner

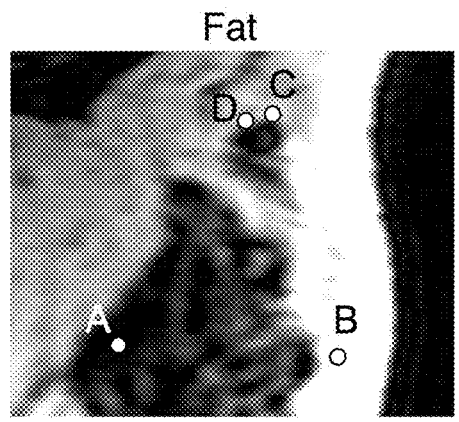
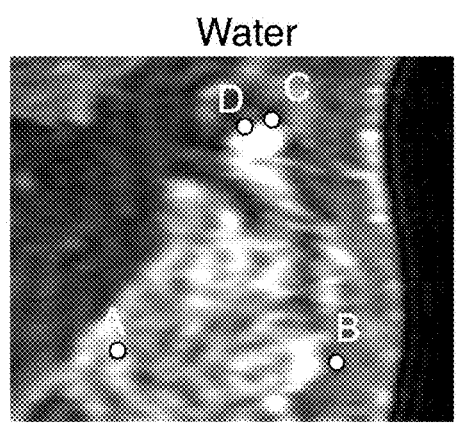
FIG. 1A
FIG. 1B
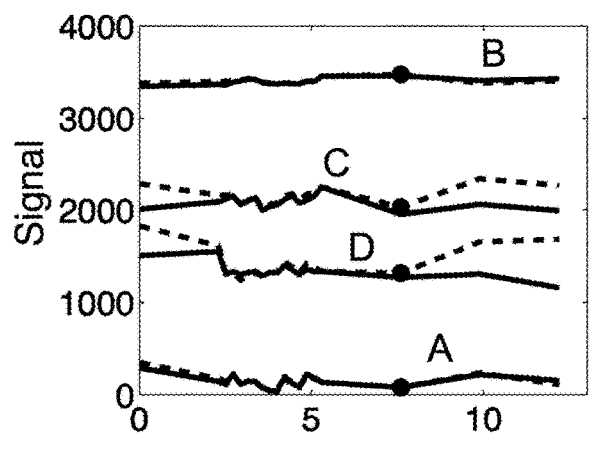
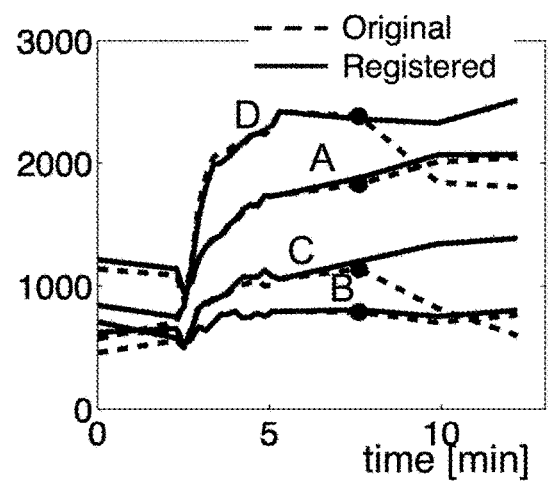
FIG. 1C
FIG. 1D

US 10,684,344 B2

MOTION CORRECTION IN TWO-COMPONENT MAGNETIC RESONANCE IMAGING

CROSS REFERENCE TO RELATED APPLICATIONS

This application claims the benefit of U.S. provisional patent application 62/317,112, filed on Apr. 1, 2016, and hereby incorporated by reference in its entirety.

GOVERNMENT SPONSORSHIP

This invention was made with Government support under contract EB009055 awarded by the National Institutes of Health. The Government has certain rights in the invention.

FIELD OF THE INVENTION

This invention relates to motion correction in magnetic resonance imaging.

BACKGROUND

Motion correction for magnetic resonance (MR) imaging is of general interest for various applications, because it is generally important to distinguish motion artifacts from real features of the MR images. One approach for performing motion correction is to register a sequence of MR images to a reference image by determining the motions that make each frame of the sequence correspond best to the reference image. However, this approach of comparing MR images to perform motion correction is difficult to apply in cases where contrast enhanced MR imaging is employed. The reason for this difficulty is that such MR imaging typically provides MR images having features (e.g., uptake of a contrast agent) that are unrelated to motion in the images. Accordingly, it would be an advance in the art to provide improved motion correction in such cases.

SUMMARY

As described in detail in section B of the detailed description below, we have found that spatially co-registered and synchronized MR water images and MR fat images as provided by the known Dixon MR imaging method enable improved motion correction to be performed as follows: 1) acquire a reference fat image; 2) determine motion corrections by comparing the sequence of fat images to the reference image; and 3) apply the motion corrections thus determined to the sequence of water images. The basis for this method is the observation that the contrast enhancement of the MR imaging shows up in the water images but not in the fat images. This makes the fat images suitable for use in determining the motion corrections, and because the fat and water images correspond to each other in both time and space, these corrections are also applicable to the water images.

More generally, this approach is applicable to any MR imaging method that provides a first sequence of MR images and a second sequence of MR images where: 1) the two sequences are inherently spatially co-registered and synchronous with each other; 2) the first sequence includes signal variation due to one or more causes other than motion or deformation; and 3) the second sequence does not include the signal variation of the first sequence. In this situation, the second sequence can be used to perform motion correction for the first sequence as in the above example of fat images providing motion correction for water images.

BRIEF DESCRIPTION OF THE DRAWINGS

FIGS. 1A-D show exemplary fat image and water image data as affected by conventional motion correction.

DETAILED DESCRIPTION

Figure 2:
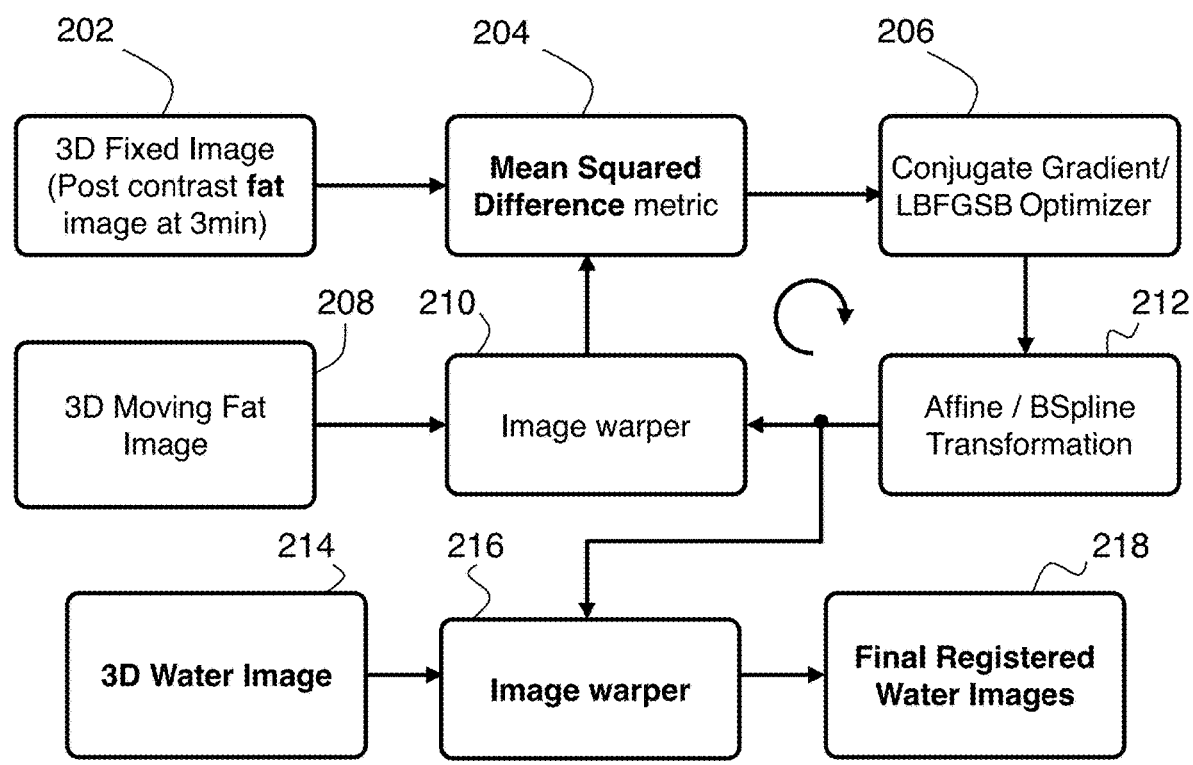
FIG. 2 is a flow chart of an exemplary motion correction method according to an embodiment of the invention.

Section A of this part describes general principles relating to embodiments of the invention. Section B of this part describes an experimental demonstration of this approach.

A) General Principles

An exemplary embodiment of the invention is a method for providing deformation-corrected magnetic resonance (MR) imaging. This method includes the steps of:

1) obtaining a first sequence of MR images where the first sequence of MR images includes signal variation due to one or more causes other than motion or deformation;
2) obtaining a second sequence of MR images, where the first sequence of MR images and the second sequence of MR images are inherently spatially co-registered to each other, where the first sequence of MR images and the second sequence of MR images are inherently synchronized to each other, and where the second sequence of MR images does not include the signal variation of the first sequence of MR images;
3) obtaining a reference MR image according to an MR methodology used to acquire the second sequence of MR images;
4) comparing each image of the second sequence of MR images to the reference MR image to determine a corresponding correction;
5) applying the corrections to each image of the first sequence of MR images to provide a corrected first sequence of MR images.

As described in detail below, one example of this general approach is Dixon MR imaging (e.g., as described in "Simple Proton Spectroscopic Imaging", W T Dixon, Radiology v153 pp. 189-194, 1984, hereby incorporated by reference in its entirety). Here the first sequence of MR images are water images as provided by Dixon MR imaging, and the second sequence of MR images are fat images as provided by Dixon MR imaging.

Various metrics can be used for the step of comparing each image of the second sequence of MR images to the reference MR image to determine a corresponding correction. Suitable metrics for this image comparison include but are not limited to: mutual information metric and mean-squared signal difference metric.

Any kind of MR imaging can be employed in connection with embodiments of the invention. For example, the signal variation of the first sequence of MR images can be dynamic contrast enhanced (DCE) imaging of a human breast. More generally, any kind of contrast-enhanced or functional MR imaging can be employed.

The corrections can account for one or more motions including: deformation, rigid body translation, and/or rigid body rotation. Sources of such motions include but are not limited to: muscle relaxation motion, cardiac motion and respiratory motion. The present-day state of the art provides image frame rates suitable for correction of muscle relaxation motion (e.g., as in the example of section B below). This approach has been applied for deformable motion of the breast due to relaxation, but could be applied for other motions if the frame rate is faster than the motion.

B) Experimental Example

B1) Introduction

Four-dimensional dynamic-contrast-enhanced (DCE) breast MRI, which is used to characterize breast lesions, takes about five to ten minutes to acquire. Within this acquisition duration, breast motion is a common problem and may require motion correction before performing post-processing analysis such as wash-out slope, time-to-peak enhancement or quantitative pharmacokinetic modeling.

The three-dimensional breast images may undergo deformable and/or bulk motion during the DCE acquisition. Iterative three-dimensional motion correction algorithms include a transformation model, similarity measure, and an optimizer to vary the transformation parameters to maximize the similarity measure. Bulk motion is usually corrected using an affine transformation model. This is followed by deformable motion correction using a free-form deformable transformation model based on b-splines, and finite element models. Intensity-based deformable registration using demon's algorithm has also been used for registering time-series images without varying signal intensity. Landmark or feature-based deformable registration has also been performed by choosing identical features in the 3D breast datasets and performing deformable motion correction on these feature points or surfaces. Feature-based registration, however, can be time consuming for high-resolution four-dimensional datasets, and several features may not be available in all the datasets.

Motion correction between images of similar signal intensity can be performed by using squared signal difference as the similarity measure. As the DCE image signals change with contrast enhancement, the motion correction is performed with normalized mutual information as the similarity metric. This metric accurately corrects rigid transformation motion between images acquired using differing image modalities. However, when the mutual information similarity metric is applied with a deformable transformation, the contrast enhancing lesions often shrink in volume.

Several methods have been proposed to reduce the errors in deformable motion correction using a mutual information metric. For example, the DCE images are de-enhanced by modeling the spatially varying intensities before performing deformable motion correction. A local volume preservation constraint is used with a deformable motion model or the enhancing lesions are assumed to be rigid during motion correction.

The fat signal in breast DCE images appears bright due to short $T_1$ and can obscure small enhancing lesions. Hence the fat signal in breast images is often suppressed using spectrally-selective inversion or saturation pulses. However, due to increased $B_0$ and $B_1$ inhomogeneities at higher field strength, fat suppression may be non-uniform and may also result in inadvertent water suppression. Post-contrast images can also be subtracted from the pre-contrast images to suppress fat, but any motion between the acquisitions could result in erroneous enhancements and non-uniform fat suppression. Dixon-based fat-water separation is robust to $B_0$ and $B_1$ inhomogeneities and provides both fat and water images that are acquired simultaneously and are co-registered, at a cost of more scan time. The fat signal does not enhance with contrast, and hence could be used for deformable motion estimation mitigating the errors introduced by the previous methods. Moreover, the fat is interspersed throughout the breast in nearly all patients, providing high signal and features for motion correction. The deformable motion from the fat images can then be used to correct the water images, and hence may reduce the likelihood of change in enhancing tumor volumes.

In this work we: (i) develop a fat-based deformable motion correction technique with mean-squared-signal-difference (MSSD) as the similarity measure; and (ii) compare the technique qualitatively and quantitatively with water-based deformable motion correction with Mattes mutual information (MMI) similarity metric.

B2) Methods

The intertwined effects of tissue motion and contrast-enhancement on fat and water signal are illustrated in FIGS. 1A-D. This is an example of simultaneously acquired fat (FIG. 1A) and water (FIG. 1B) breast post-contrast images. The Gadolinium contrast agent leaks through the blood vessels into the extravascular space causing signal changes over time in the water image, such as the rapid signal enhancement in a fibroadenoma, that is near voxels C and D of FIG. 1B. These voxels in the water image (FIG. 1B) show washout signal characteristics due to both contrast uptake as well as motion (FIG. 1D—dashed lines), but when motion is corrected the uptake is persistent—an important distinction for diagnosis (FIG. 1D—solid lines). The corresponding voxels in the fat-image of FIG. 1A show signal variations in time due to motion alone (FIG. 1C—dashed lines), as the fat-signal does not enhance. Hence the three-dimensional image displacements can be estimated from the temporal fat signal variations when fat-water separated images are available. These fat-based image displacements can later be used to deform the water images. Voxels A and B that are in the uniformly enhancing or non-enhancing regions respectively did not exhibit temporal fat-signal variations (FIG. 1C—dashed lines). Hence the temporal dynamics of the corresponding voxels in the water signal were also unaltered after motion correction (FIG. 1D—dashed vs. solid lines).

B2a) Fat-Based Motion Correction

Three-dimensional fat-based motion registration was performed with MSSD (mean-square signal difference) as the similarity metric. Bulk motion was estimated using affine transformation and was followed by a b-spline transformation for deformable motion correction. The motion correction was performed in a 3D volume of a single breast with a b-spline grid with five control points along each dimension. Water images were then warped using the corresponding fat-based affine and b-spline transforms.

The motion correction algorithm was implemented in Insight Segmentation and Registration Toolkit (ITK). The 3D fat image acquired at three minutes post contrast injection was considered as the reference image for motion correction. All of the other post-contrast and pre-contrast images were motion corrected to match this reference frame. The images were affine transformed with MSSD as the metric and conjugate gradient as the optimizer. The number of iterations of the optimizer was set to 200 with minimum convergence value of $10^{-7}$. This was followed by b-spline transformation with the same metric and LBFGSB (Limited memory Broyden Fletcher Goldfarb Shannon minimization with Simple Bounds) optimizer. The number of iterations of the optimizer was set to 500 and cost function convergence factor was $10^9$. The combined affine and b-spline transformation of the fat images was then applied to the water images. The individual steps of the fat-based registration method implemented in ITK are detailed in FIG. 2.

More specifically, 202 on FIG. 2 is acquisition of the reference fat image, and 208 is the sequence of fat images from which motion corrections are to be derived. Motion correction is determined iteratively by warping (210) a frame from the fat image sequence, computing an image difference between the warped and reference images using a metric (204), computing a updated transformation (212) for image warping, and iterating via an optimization method (206) until the warped image from sequence 208 matches the reference image. The transformation as determined in this manner is then applied (216) to the corresponding frame from the water image sequence (214). Repeating this process for the entire sequences of corresponding fat and water images gives the desired motion-corrected water images (218).

As a standard registration method for comparison, the water-based registration was performed with MMI similarity metric with identical transformations and optimizers as fat-based registration. The MMI metric in ITK computes the negative of the mutual information. Hence a lower MMI metric means greater mutual information between the two images. The fat images were also then warped using the deformation of water images for further quantitative analysis.

B2b) In Vivo Imaging

The quantitative and qualitative image quality of the original unregistered image series and images from both fat- and water-based registration methods were evaluated in 14 patients (2 bilateral) with known lesions (age=24 to 70 years). Our Institutional Review Board approved the protocol, and informed consent was obtained from the patients. The 14 patients had 24 lesions with 15 malignant lesions (10 invasive ductal carcinoma and 5 ductal carcinoma in situ) and 9 benign lesions (3 fibroadenoma, 2 adenosis, 1 radial scar, 1 papilloma with usual ductal hyperplasia, 1 atypical lobular hyperplasia and 1 florid usual ductal hyperplasia). The largest dimension of the malignant lesions varied from 10.6 cm to 0.8 cm, and the largest dimension of the benign lesions varied from 1.8 cm to 0.8 cm. Three-dimensional RF-spoiled gradient echo fat-water separated DCE images were acquired using DISCO (DIfferential Subsampling with Cartesian Ordering), a pseudorandom $k_y$-$k_z$ sampling scheme enabling a favorable tradeoff between temporal and spatial resolution, on a 3T scanner (GE Healthcare, Waukesha, Wis.). The imaging parameters were: field-of-view (FOV)=300×360 mm, receiver bandwidth=325 Hz/pixel, echo times ($TE_1/TE_2$)=2.2/3.3 ms, repetition time (TR)=6.2 ms, flip angle=12°, number of slices=188, parallel imaging reduction factor of 2.5×2.0, partial echo factor=0.8 along readout direction, number of acquired DISCO "B regions"=4, and percentage of k-space included in the innermost DISCO "A region" was 16%. One pre-contrast and four post-contrast images were acquired with high spatial resolution of 0.5×0.6×1.0 mm$^3$ and low temporal resolution of 2 min. Fourteen images were acquired during the wash-in period with a high temporal resolution of 13 s and lower spatial resolution of 0.5×1.2×2.0 mm$^3$. All of the images were reconstructed to identical spatial resolution before performing fat- and water-based registration. Fat-water separation was performed using a two-point Dixon algorithm.

B2c) Qualitative Analysis

The image quality of the original, water- and fat-based registration methods was reviewed by two experienced readers. All the three datasets were presented in random order in axial, sagittal and coronal planes. The dicom images were displayed in the 4D viewer of Osirix software (24). The images were scored in a scale of 0 to 2. A score of 0 was given to images with minimal motion of less than 2 voxels in each direction in both tumor and surrounding tissue. Similarly, a score of 1 was given to residual motion of 2 to 4 voxels, and score of 2 for motion greater than 4 voxels. The readers also ranked the image quality from best (rank 1) to worst (rank 3). The statistical analysis was performed in MATLAB® 2015a (Mathworks, Natick, Mass., USA). The statistical differences in score and rank of the three groups were determined using Friedman test with p<0.05. The pairwise significance between the groups was performed using a Tukey-Kramer method with p<0.05.

B2d) Quantitative Analysis

The image registration quality was measured by calculating the average MSSD metric between the three-dimensional reference image and each of the 3D temporal phases of the fat images in the original, fat- and water-based registration methods. Similarly, the average MMI metric was calculated in the 3D water images of the original, fat- and water-based registration methods. The statistical differences between the original and the new registration methods were measured using a repeated measures ANOVA test with p<0.05. Pairwise statistical differences between original, water- and fat-based registration methods was determined using Tukey-Kramer method with p<0.05.

B3) Results

Figure 3:
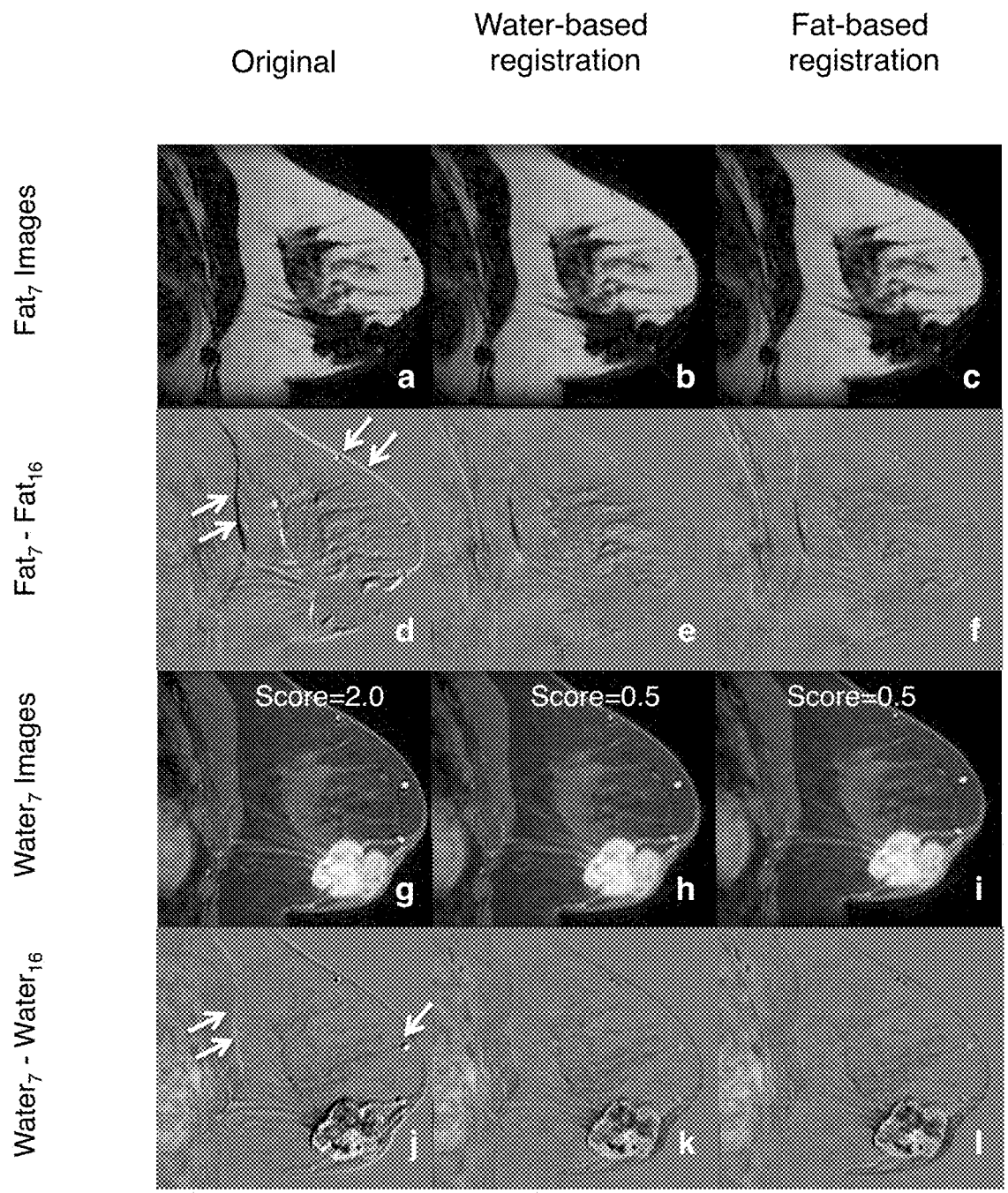
FIG. 3 shows fat images and water images of a breast with motion corrected according to water-based registration and according to fat-based registration.

FIG. 3 shows a single reformatted sagittal slice of the seventh temporal phase of the fat images (a-c), difference between the fat image in seventh temporal phase and the reference phase (fat16) (d-f), water image (g-i), and difference between the water image and the reference phase water image (j-l). The bright and dark regions (arrows) in the original subtracted images (d,j) indicate the motion in the slice. Both water-based (e,k) and fat-based (f,l) registration methods have reduced bright and dark regions in the difference images indicating motion correction. The mean qualitative scores on these images show that both water- and fat-based registration methods reduced the motion (score=0.5) compared to the original images (score=2.0).

Figure 4:
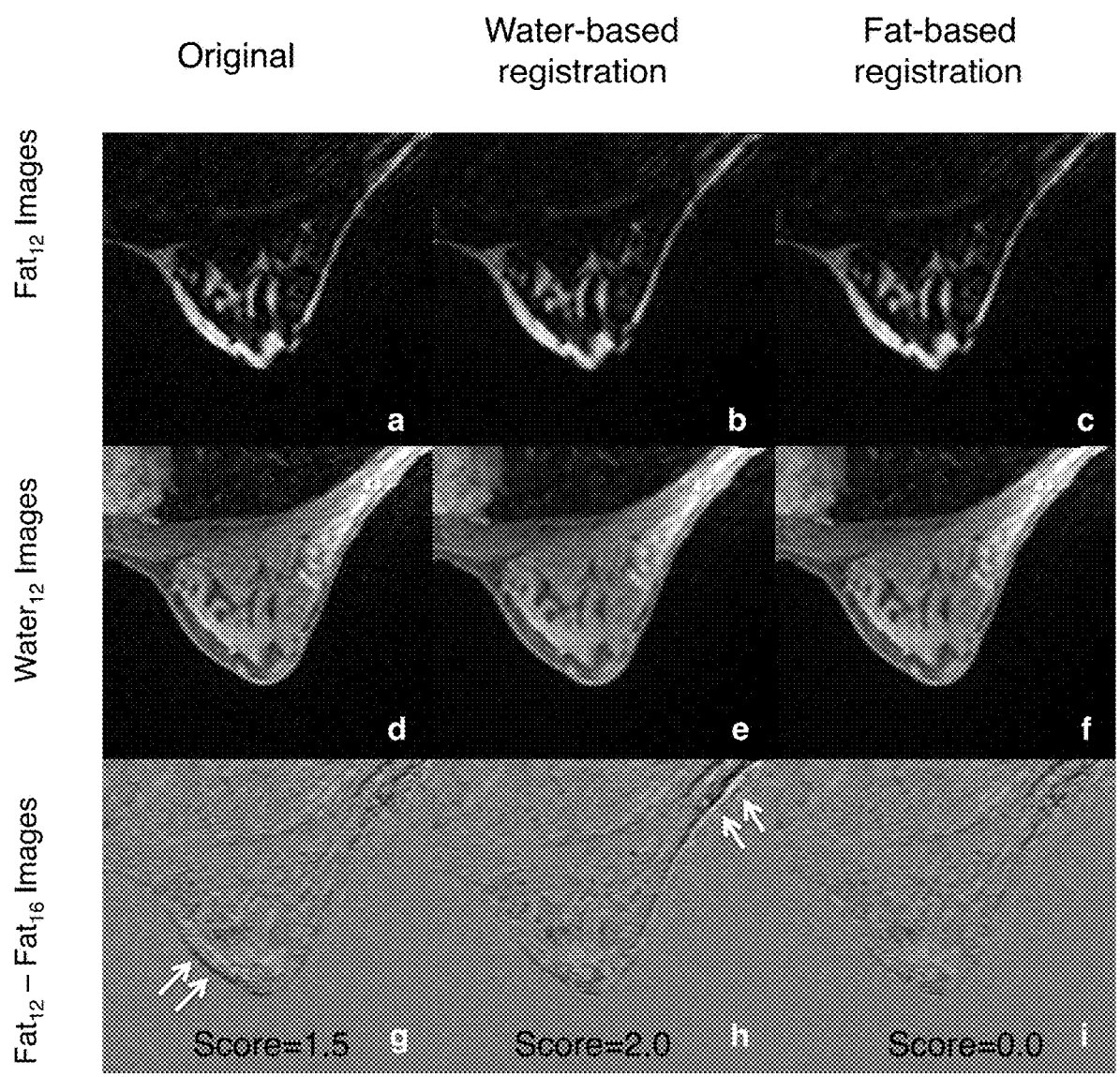
FIG. 4 shows further fat images and water images of a breast with motion corrected according to water-based registration and according to fat-based registration.

FIG. 4 compares the fat images (a-c), water images (d-f), and the difference in fat images with respect to the reference fat image (g-i) of an example dense breast with minimal motion (arrows). Image h on this figure shows that the water-based registration method introduces new motion (arrows) compared to the original images (g), and the fat-based registration (i) reduces the original motion without introducing new motion. The mean qualitative score of the original image was 1.5, water-based was 2.0 and fat-based registration was 0.0.

Figure 5A:
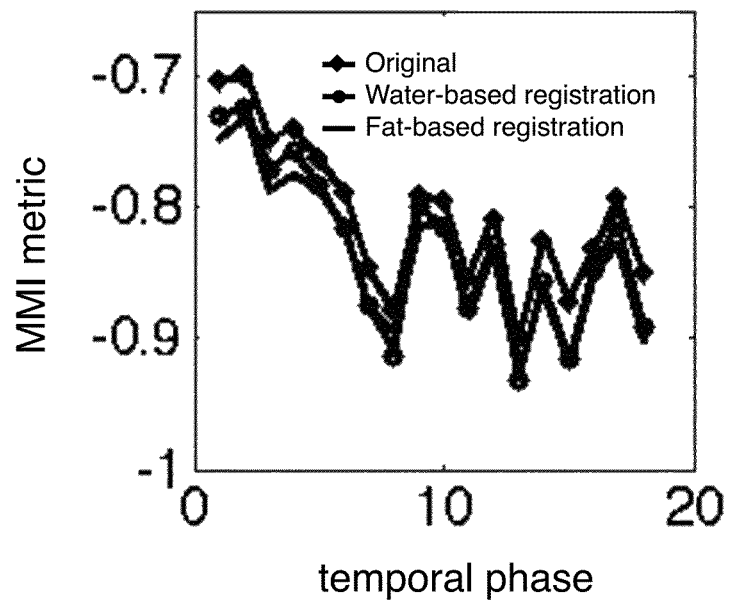
FIG. 5A shows MMI image metric calculated over the water images in FIG. 4.
Figure 5B:
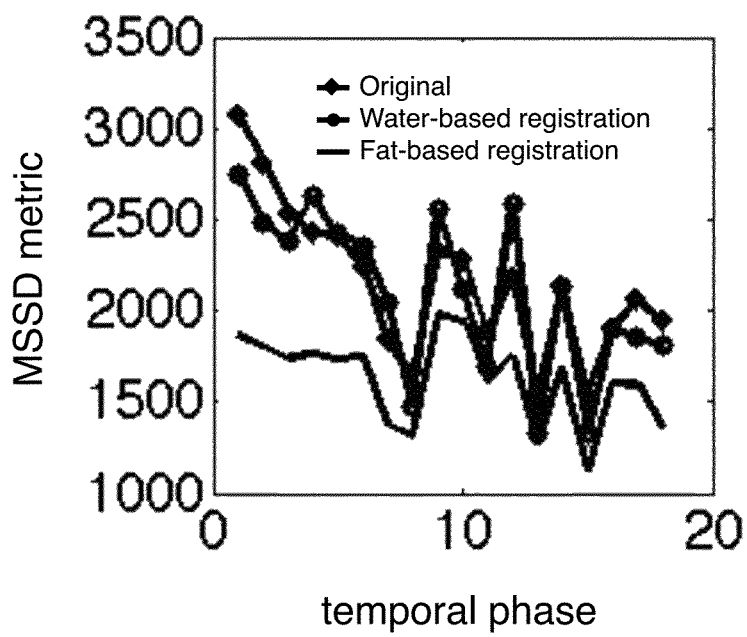
FIG. 5B shows MSSD image metric calculated over the fat images in FIG. 4.

The MMI metric calculated over the 3D water images for all of the three methods (FIG. 5A), shows that both water- and fat-based registration method have a better metric compared to the original images. This metric, however, does not depict the new motion that is visible both qualitatively as well as in the subtracted fat images. The MSSD metric (FIG. 5B), on the other hand, clearly shows that in a few phases the water-based registration method (circle data points) has a higher metric (new motion) compared to the original images. The fat-based registration method had a lower metric for all of the temporal phases compared to the original images, even in this example of dense breast with relatively less fat tissue. This metric also compares well with the qualitative scores.

Figure 6:
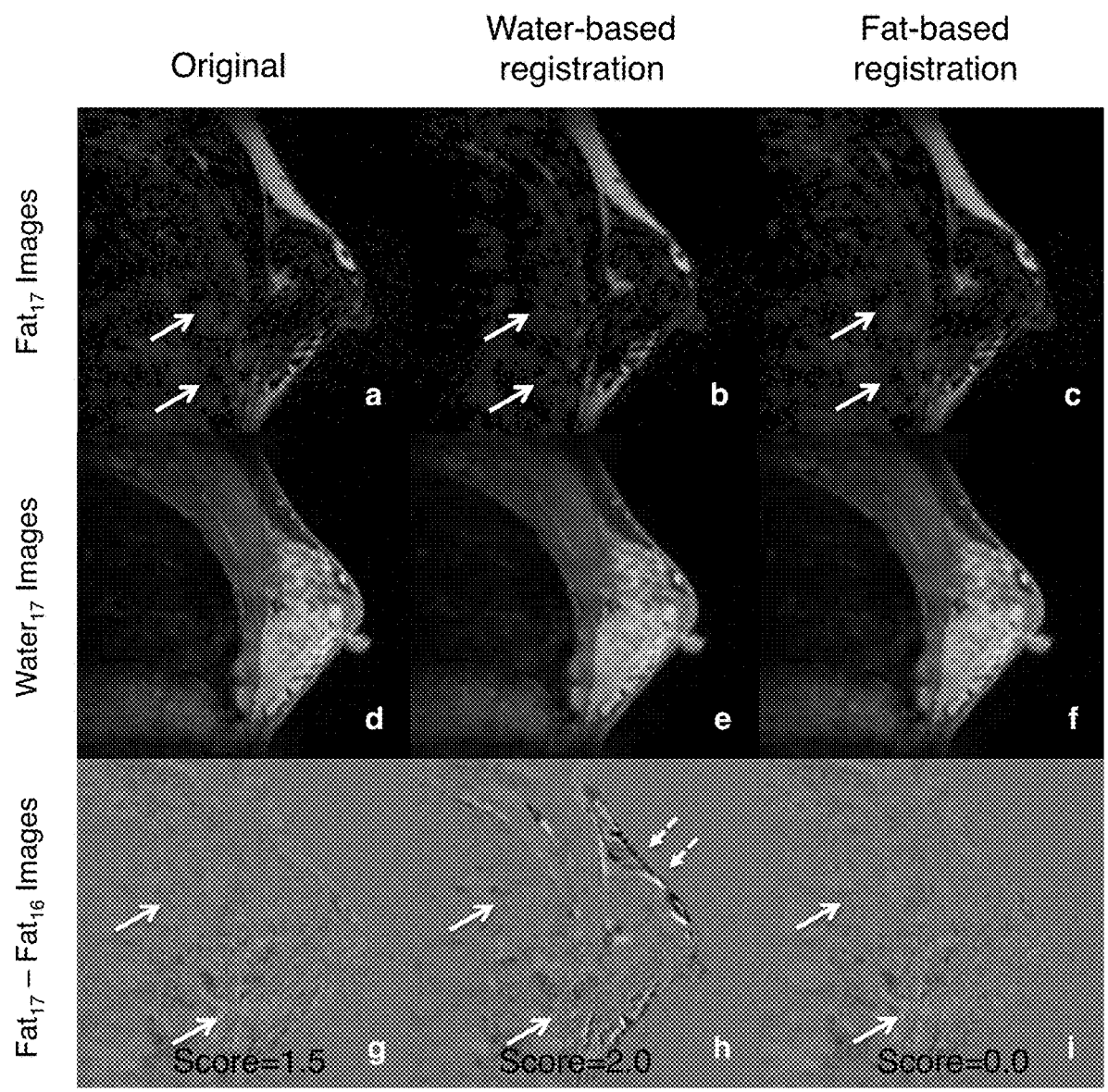
FIG. 6 shows further fat images and water images of a breast with motion corrected according to water-based registration and according to fat-based registration.
Figure 7A:
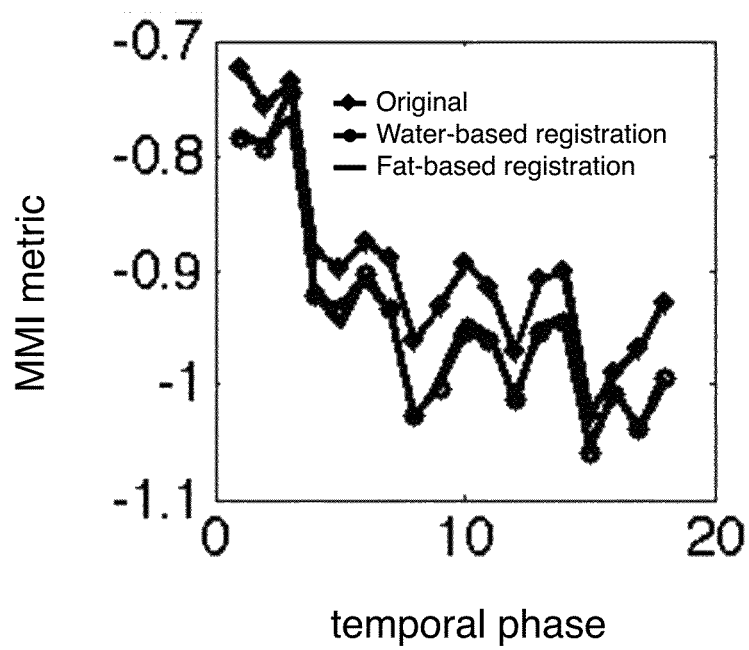
FIG. 7A shows MMI image metric calculated over the water images in FIG. 6.
Figure 7B:
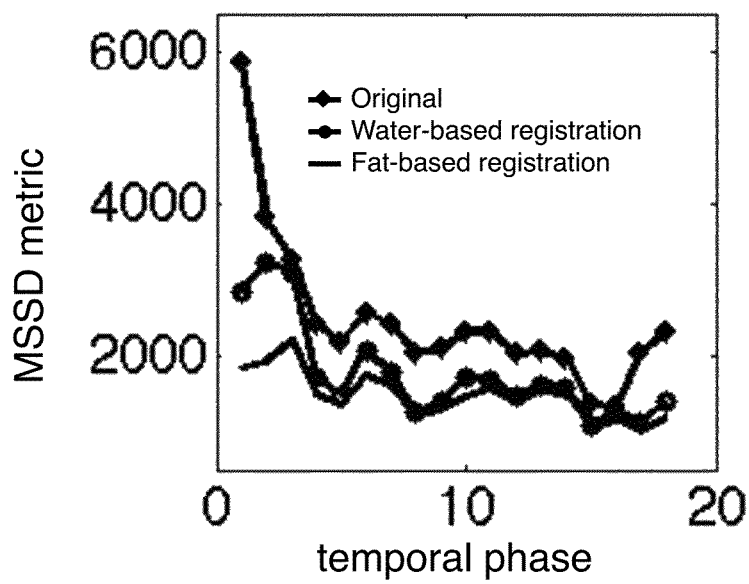
FIG. 7B shows MSSD image metric calculated over the fat images in FIG. 6.

FIG. 6 shows another example comparison of original unregistered images (a,d,g), water-based (b,e,h) and fat-based (c,f,i) registered images of a dense breast. In this example, the water-based registration has introduced new motion (dashed arrows on image h) compared to both original and fat-based registration. Cardiac flow artifacts (solid arrows) are reduced in water-based registration compared to both original and fat-based registration. These flow artifacts could be introducing new motion in the water-based registration method. The MMI metric (FIG. 7A) is lower for both water-based and fat-based registration methods compared to the original images. The MSSD metric (FIG. 7B) is lowest for the fat-based registration compared to original and water-based registration, even though it does not capture the introduction of the new motion by the water-based method compared to the original images.

The average image quality scores of the acquired unregistered images, water-based and fat-based registration methods are tabulated in Table 1a. A Friedman test showed significant ($p<0.01$) differences between the three datasets. The pairwise comparison of the original, water- and fat-based registered image series showed that the registered images received a significantly lower score than the original images. All of the fat-based registered image series were scored better than the original image series. Three to four water-based registered datasets received a score of 2 that was equal to or higher than the original images due to insufficient motion compensation or introduction of new motion.

TABLE 1a

Qualitative study - score of the original, water-and fat-based registered images.

| Score | | Original | Water-based | Fat-based |
|---|---|---|---|---|
| Mean ± standard deviation [Range] | Reader 1 | 1.6 ± 0.6 [0 to 2] | 0.9 ± 0.7 [0 to 2] | 0.3 ± 0.5 [0, 1] |
| | Reader 2 | 1.4 ± 0.7 [0 to 2] | 0.8 ± 0.9 [0 to 2] | 0.2 ± 0.4 [0, 1] |
| | p | | 0.02¶ | |
| | | | | 0.12 |
| | | | $p < 0.01$* | $p < 0.01$* |

¶indicates significant difference between the original and water-based registration, and
*indicates significant difference between the original and fat-based registration method.

Table 1b shows the rank of the original, water- and fat-based registered images. The water- and fat-based registered images received a significantly lower rank compared to the original images. There was no significant difference in the rank between the water- and fat-based registered images.

TABLE 1b

Qualitative study - rank of the original, water-and fat-based registered images.

| Rank | | Original | Water-based | Fat-based |
|---|---|---|---|---|
| Mean ± standard deviation [Range] | Reader 1 | 2.8 ± 0.5 [2, 3] | 2.0 ± 0.7 [1 to 3] | 1.3 ± 0.5 [1, 2] |
| | Reader 2 | 2.8 ± 0.4 [2, 3] | 1.9 ± 0.7 [1 to 3] | 1.3 ± 0.5 [1, 2] |
| | p | | 0.03¶ | |
| | | | | 0.06 |
| | | | $p < 0.01$* | $p < 0.01$* |

¶indicates significant difference between the original and water-based registration, and
*indicates significant difference between the original and fat-based registration method.

Figure 8A:
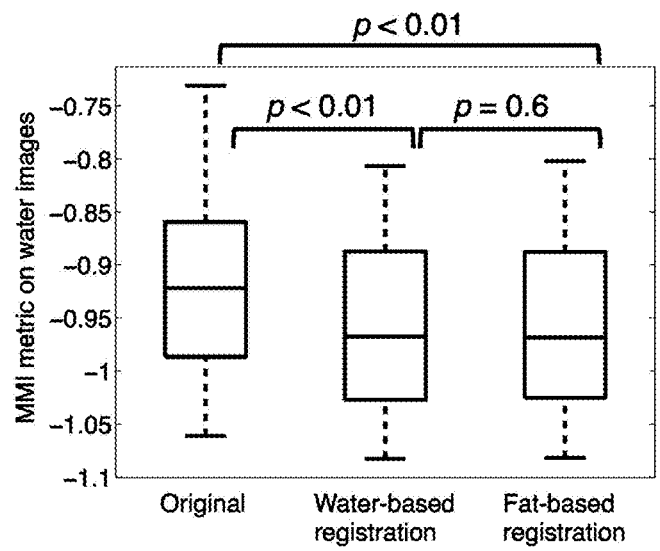
FIG. 8A shows a box-whisker plot of the average MMI metric calculated over the datasets.
Figure 8B:
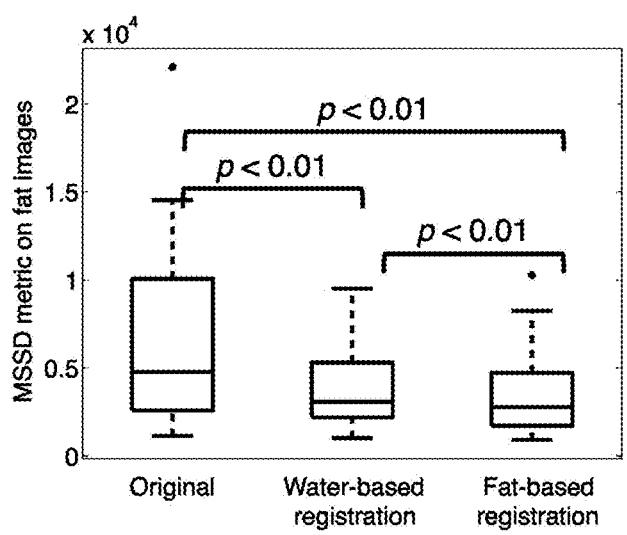
FIG. 8B shows a box-whisker plot of the average MSSD metric calculated over the datasets.
Figure 8C:
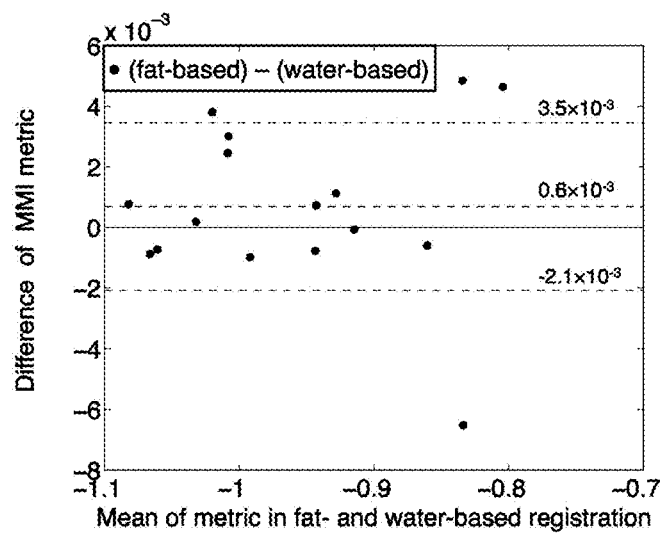
FIG. 8C is a Bland-Altman plot of the MMI metric of water images of fat- and water-based registration methods.
Figure 8D:
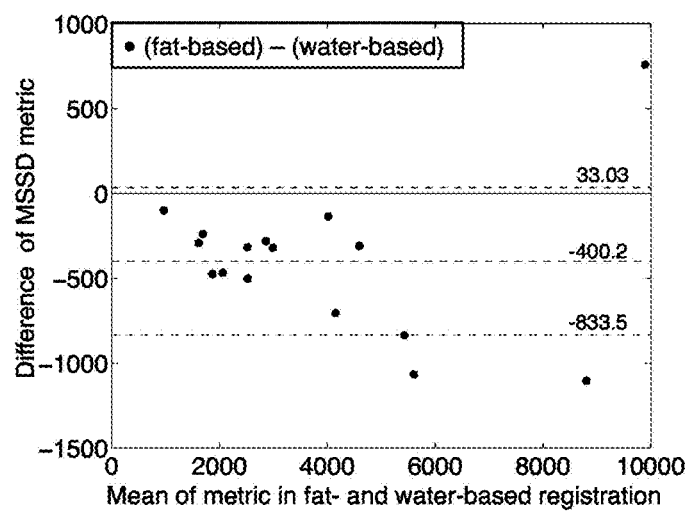
FIG. 8D is a Bland-Altman plot of the MSSD metric of fat images of fat- and water-based registration methods.

FIG. 8A shows the box-whisker plot of the average MMI metric calculated over all the temporal phases for the 16 datasets. The average MMI metric on the water images showed that both water-based and fat-based registered images had significantly lower metric than the original images. However, there was no significant difference between the two registration methods. This is also shown in the Bland-Altman plots (FIG. 8C) of the MMI metric of fat- and water-based registration methods have a zero bias showing a minimal difference in the metric between the two methods. The MSSD metric on the fat images (FIG. 8B) also showed that both fat-based and water-based registration methods had a significantly lower metric compared to the unregistered original images. In addition, the fat-based registration had a significantly lower metric than the original and water-based registration methods. The Bland-Altman plot for fat- and water-based MSSD metrics for the 16 datasets (FIG. 8D) show that the fat-based registration metric is reduced in 15/16 breasts compared to the water-based registration, with a mean bias of −400.2.

B4) Discussion

Breast deformable registration is performed using mutual information similarity metric on images with varying signal due to contrast injection, and is susceptible to the introduction of new motion. The fat signal on DCE breast images, on the other hand, is a potentially useful reference for motion registration, both because it provides bright signal and because the signal does not enhance with contrast injection. The latter also allows MSSD to be used as a similarity metric. The deformation transformation from the fat images can then be applied to corresponding water images provided that they were acquired simultaneously, for example using Dixon-based techniques. This fat-based registration method corrected the motion observed in the original images and did not introduce new motion when compared to water-based registration method. Even in patients with dense breasts, the subcutaneous fat surrounding the central cone of fibroglandular tissue was sufficient for estimation of the deformable motion as shown in FIGS. 4 and 6.

The registration can be affected in the presence of cardiac flow artifacts. In the example shown in FIG. 6, the random flow artifacts from cardiac motion were stabilized in the fat images of the water-based registration method using MMI metric. However this stabilization of cardiac flow artifacts could have introduced the spurious new motion into the water-based registered images of the breast. In contrast, registration based on the MSSD metric in fat images was robust even in the presence of cardiac motion artifacts, and reduced breast motion in the original images without altering the flow artifacts or introducing new spurious motion.

Further studies can be performed on datasets with flow artifacts to evaluate the benefits of the choice of similarity metric.

The quantitative analyses were performed by analyzing the MSSD metric on the fat images, and the MMI metric on the water images for the acquired, water- and fat-based registered images. However, these metrics were also used as a similarity metric for performing the registration. Therefore the MSSD metric on fat images of the fat-based registered images could have been biased compared to the MSSD metric on fat images of the water-based registered images. However, such biases were not evident in the MMI metric evaluated on the water images of fat- and water-based registration.

During warping, the 3D images were interpolated and potentially introduced minimal blurring in patients with motion greater than 4 voxels regardless of the choice of registration methods. The image quality including blurriness can be further evaluated in more patients with significant motion.

The fat-based registration algorithm is based on the assumption that all signal intensity differences in the images are due to the motion. However, if the fat-water separation is incomplete with inconsistent fat-water swaps in the temporal image series, the fat-based registration may fail. In our study population of 14 patients, the fat and water separated images did not have any regional swaps. Furthermore, Dixon-based methods continue to improve in robustness, so the use of fat-based registration remains promising for future studies.

B5) Conclusion

Fat-based registration of breast DCE images reduces the motion qualitatively and quantitatively compared to both the original acquired images and the water-based registered images.

The invention claimed is:

1. A method for providing deformation-corrected magnetic resonance (MR) imaging, the method comprising:
    obtaining a first sequence of MR images;
    obtaining a second sequence of MR images, wherein the first sequence of MR images and the second sequence of MR images are inherently spatially co-registered to each other, and wherein the first sequence of MR images and the second sequence of MR images are inherently synchronized to each other;
    wherein the first sequence of MR images includes first signal variation due to one or more causes other than motion or deformation;
    wherein the second sequence of MR images does not include second signal variation due to the one or more causes;
    obtaining a reference MR image according to an MR methodology used to acquire the second sequence of MR images;
    comparing each image of the second sequence of MR images to the reference MR image to determine a corresponding correction;
    applying the corrections to each image of the first sequence of MR images to provide a corrected first sequence of MR images.

2. The method of claim 1,
    wherein the first sequence of MR images are water images as provided by Dixon MR imaging, and
    wherein the second sequence of MR images are fat images as provided by Dixon MR imaging.

3. The method of claim 1, wherein the comparing each image of the second sequence of MR images to the reference MR image to determine a corresponding correction comprises:
    comparing images with a mutual information metric.

4. The method of claim 1, wherein the comparing each image of the second sequence of MR images to the reference MR image to determine a corresponding correction comprises:
    comparing images with a mean-squared signal difference metric.

5. The method of claim 1, wherein the first signal variation comprises dynamic contrast enhanced (DCE) imaging of a human breast.

6. The method of claim 1, wherein the corrections account for one or more motions selected from the group consisting of: deformation, rigid body translation, and rigid body rotation.

7. The method of claim 1, wherein the corrections account for one or more motions selected from the group consisting of: muscle relaxation motion, cardiac motion and respiratory motion.

* * * * *